US008569088B2

(12) United States Patent  
Orita (10) Patent No.: US 8,569,088 B2  
(45) Date of Patent: Oct. 29, 2013

(54) SEMICONDUCTOR LIGHT-EMITTING ELEMENT AND MANUFACTURING METHOD THEREOF

(75) Inventor: Kenji Orita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/621,065

(22) Filed: Sep. 15, 2012

(65) Prior Publication Data

US 2013/0009203 A1 Jan. 10, 2013

Related U.S. Application Data

(63) Continuation of application No. PCT/JP2010/006017, filed on Oct. 7, 2010.

(30) Foreign Application Priority Data

Mar. 23, 2010 (JP) .................................. 2010-065555

(51) Int. Cl.
*H01S 5/00* (2006.01)

(52) U.S. Cl.
USPC ...... 438/46; 257/103; 257/126; 257/E33.013; 438/45

(58) Field of Classification Search
USPC ............... 257/103, 126, E33.013; 438/45–47
See application file for complete search history.

(56) References Cited

U.S. PATENT DOCUMENTS

| 5,008,889 | A * | 4/1991 | Wilson | 372/32 |
| 7,019,325 | B2 * | 3/2006 | Li et al. | 257/14 |
| 7,944,567 | B2 * | 5/2011 | Asano | 356/497 |
| 2010/0074290 | A1 | 3/2010 | Kawaguchi et al. | |

FOREIGN PATENT DOCUMENTS

| JP | 2007-165599 | 6/2007 |
| JP | 2008-066442 | 3/2008 |
| WO | WO 2009/057254 A1 | 5/2009 |

OTHER PUBLICATIONS

English translation of JP2007-165599.*
F. Feltin et al., Broadband blue superluminescent light-emitting diodes based on GaN, Applied Physics Letters, 2009, vol. 95, No. 8, p. 081107.
Gerard A. Alphonse et al., High-Power Superluminescent Diodes, IEEE Journal of Quantum Electronics, vol. 24, No. 12, p. 2454, Dec. 1988.
International Search Report of PCT/JP2010/006017 with a mail date of Nov. 2, 2010.

* cited by examiner

*Primary Examiner* — John C Ingham
(74) *Attorney, Agent, or Firm* — McDermott Will & Emery LLP (57) ABSTRACT

A semiconductor light-emitting element includes: a substrate; and a nitride semiconductor multilayer film provided on an upper surface of the substrate and including an active layer. A recess, a stepped portion, or a protruding portion is formed in an active layer or a layer that contacts a lower surface of the active layer. A ridge stripe, which has a front end facet and a rear end facet and serves as an optical waveguide, is formed in an upper part of the nitride semiconductor multilayer film. The distance from a lateral center of the ridge stripe to a lateral center of the recess, the stepped portion, or the protruding portion changes continuously or in stages from the front end facet toward the rear end facet. Bandgap energy of the active layer changes continuously or in stages from the front end facet toward the rear end facet.

16 Claims, 8 Drawing Sheets

FIG.8A COMPARATIVE EXAMPLE

FIG.8B PRESENT INVENTION

SEMICONDUCTOR LIGHT-EMITTING ELEMENT AND MANUFACTURING METHOD THEREOF

CROSS-REFERENCE TO RELATED APPLICATION

This is a continuation of PCT International Application PCT/JP2010/006017 filed on Oct. 7, 2010, which claims priority to Japanese Patent Application No. 2010-065555 filed on Mar. 23, 2010. The disclosures of these applications including the specifications, the drawings, and the claims are hereby incorporated by reference in their entirety.

BACKGROUND

The technique described in the specification relates to incoherent semiconductor light-emitting elements having high luminous efficiency.

Superluminescent diodes (hereinafter referred to as the "SLDs") have received attention as an incoherent light source that is required in the field of optical measurement such as a fiber gyroscope and medical optical coherent tomography (OCT). The SLDs are semiconductor light-emitting elements using an optical waveguide, as is the case with semiconductor laser diodes (hereinafter referred to as the "LDs"). In the SLDs, spontaneous emission light produced by recombination of injected carriers is amplified with high gain due to stimulated emission while traveling toward a light-emitting end facet, and is emitted from the light-emitting end facet. The SLDs are different from the LDs in that the SLDs suppress formation of an optical cavity due to end facet reflection so that no laser oscillation with the Fabry-Perot (FP) mode occurs. Thus, like normal light-emitting diodes, the SLDs have an incoherent property and a broad spectrum profile, and are capable of providing output of up to about several tens of milliwatts. Accordingly, the SLDs are used in optical fiber gyroscopes etc. In particular, the SLDs using a nitride semiconductor (GaN) have been expected to be applied to video projection systems such as laser displays, as a high output incoherent light source of a visible range from ultraviolet to green (F. Feltin, A. Castiglia, G. Cosendey, L. Sulmoni, J. F. Carlin, N. Grandjean, M. Rossetti, J. Dorsaz, V. Laino, M. Duelk, and C. Velez, Applied Physics Letters, 2009. Vol. 95, No. 8, p. 081107).

Figure 6A:
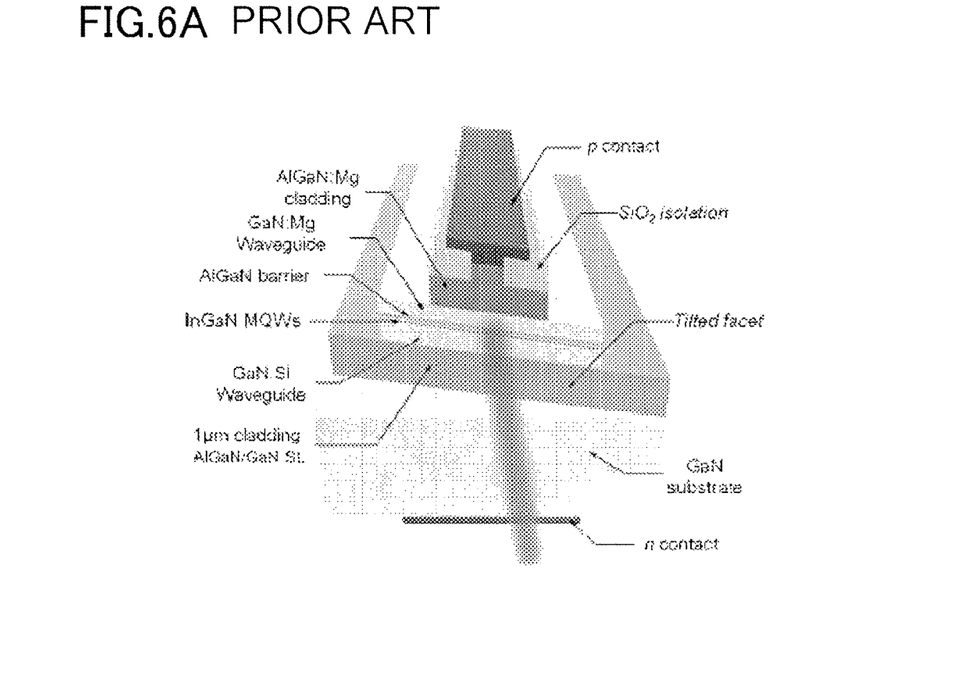
FIG. 6A is a schematic diagram showing a conventional GaN-based SLD.
Figure 6B:
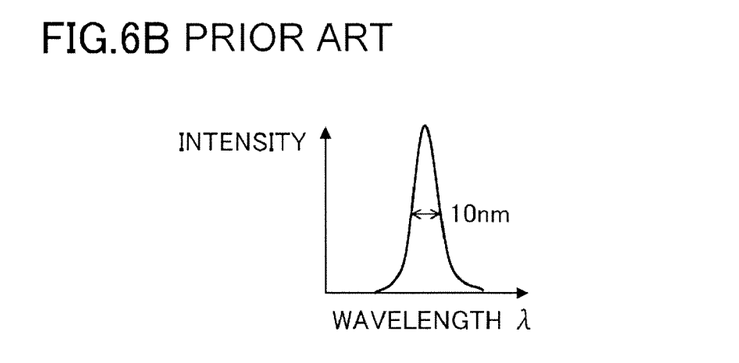
FIG. 6B is a graph showing a wavelength spectrum of emitted light of the SLD.

FIG. 6A is a schematic diagram showing a conventional GaN-based SLD described in F. Feltin, A. Castiglia, G. Cosendey, L. Sulmoni, J. F. Carlin, N. Grandjean, M. Rossetti, J. Dorsaz, V. Laino, M. Duelk, and C. Velez, Applied Physics Letters, 2009, Vol. 95, No. 8, p. 081107. FIG. 6B is a graph showing a wavelength spectrum of emitted light of the SLD. Mode reflectance is reduced by tilting a ridge optical waveguide at several degrees with respect to a light-emitting end facet. The SLD has a device structure similar to that of a semiconductor laser except that the optical waveguide is tilted with respect to a substrate end facet, namely principal surfaces of an active layer and a cladding layer are tilted with respect to a principal surface of a GaN substrate.

SUMMARY

However, in the GaN-based SLD reported in F. Feltin, A. Castiglia, G. Cosendey, L. Sulmoni, J. F. Carlin, N. Grandjean, M. Rossetti, J. Dorsaz, V. Laino, M. Duelk, and C. Velez, Applied Physics Letters, 2009, Vol. 95 No. 8, p. 081107, the full width at half maximum (FWHM) of the emission spectrum is about 10 nm. This is narrower than the FWHM of an emission spectrum of a light-emitting device (LED), which is about 20 nm. The wider the emission spectrum is, the more the Rayleigh backscattering in an optical fiber gyroscope decreases, and the more the noise can be reduced. In video projection systems as well, the wider the emission spectrum of a light source is, the more the speckle noise is reduced, and the more the video image quality is improved. Thus, it is desirable to increase the width of the emission spectrum of the SLD.

In the SLD using the tilted optical waveguide shown in F. Feltin, A. Castiglia, G. Cosendey, L. Sulmoni, J. F. Carlin, N. Grandjean, M. Rossetti, J. Dorsaz, V. Laino, M. Duelk, and C. Velez, Applied Physics Letters, 2009, Vol. 95, No. 8, p. 081107, since a front end facet and a rear end facet are the same for light guided through the optical waveguide, the same optical output is emitted from the two end facets. Since half of the light produced in the SLD is emitted from the rear end facet, the light produced in the SLD cannot be effectively used, resulting in low luminous efficiency. In the case where the optical waveguide is tilted with respect to the end facet, the mode reflectance of the optical waveguide remains low even if a coating film having high reflectance of plane waves is formed on the end facet. The light emitted from the rear end facet of the SLD can be collected to some degree by providing a reflective mirror etc. in a mount package. However, this increases the cost of the package.

A semiconductor light-emitting element according to an embodiment disclosed in the specification has a wide emission spectrum and can have high luminous efficiency. A manufacturing method according to an example embodiment can avoid a significant increase in manufacturing cost.

If a light-emitting structure is grown after providing a recess, a stepped portion, or a protruding portion in a substrate or in a semiconductor layer on the substrate, bandgap in an active layer can be controlled so that the bandgap in a region near the recess, the stepped portion, or the protruding portion becomes different from that in a region away from the recess, the stepped portion, or the protruding portion. Based on this, the inventor intensively studied to solve the problems of the related art, namely to achieve an increased emission spectrum and improved luminous efficiency, and arrived at the present invention.

A semiconductor light-emitting element according to an example embodiment of the present invention includes: a substrate; and a nitride semiconductor multilayer film provided on an upper surface of the substrate and including an active layer that produces light during operation, wherein a recess, a stepped portion, or a protruding portion is formed in an active layer or a layer of the nitride semiconductor multilayer film which contacts a lower surface of the active layer, a ridge stripe, which has a front end facet and a rear end facet facing the front end facet and serves as an optical waveguide, is formed in an upper part of the nitride semiconductor multilayer film, a distance from a lateral center of the ridge stripe to a lateral center of the recess, the stepped portion, or the protruding portion changes continuously or in stages from the front end facet toward the rear end facet, and bandgap energy of the active layer changes continuously or in stages from the front end facet toward the rear end facet.

According to this configuration, the bandgap energy of the active layer is changed continuously or in stages by continuously changing the distance from the lateral center of the ridge stripe to the lateral center of the recess, the stepped portion, or the protruding portion from the front end facet toward the rear end facet. Thus, an optical gain peak wavelength can be changed continuously or in stages within the same element, whereby a wavelength range in which optical amplification occurs can be increased while maintaining optical amplification in the optical waveguide. Moreover, controlling the distance from the lateral center of the ridge stripe to the lateral center of the recess, the stepped portion, or the protruding portion can suppress absorption of guided light by the active layer near the front end facet while allowing the guided light to be absorbed by the active layer near the rear end facet. Thus, luminous efficiency can be improved at low cost without providing, e.g., a reflective mirror on the rear end facet.

A semiconductor light-emitting element according to another example embodiment includes: a substrate; and a nitride semiconductor multilayer film provided on an upper surface of the substrate and including an active layer, wherein a recess, a stepped portion, or a protruding portion is formed in the active layer or a layer of the nitride semiconductor multilayer film which contacts a lower surface of the active layer, a ridge stripe, which has a front end facet and a rear end facet facing the front end facet and serves as an optical waveguide, is formed in an upper part of the nitride semiconductor multilayer film, and a depth of the recess, a depth of the stepped portion, or a height of the protruding portion changes continuously or in stages from the front end facet toward the rear end facet.

According to this configuration, bandgap energy of the active layer can be changed from the front end facet toward the rear end facet by the depth of the recess, the depth of the stepped portion, or the height of the protruding portion. Thus, a wavelength range in which optical amplification occurs can be increased while maintaining optical amplification in the optical waveguide.

A method for manufacturing a semiconductor light-emitting element according to still another example embodiment of the present invention includes the steps of: (a) providing a recess, a stepped portion, or a protruding portion in a substrate or a semiconductor layer on the substrate, and then forming on an upper surface of the substrate or an upper surface of the semiconductor layer a nitride semiconductor multilayer film including an active layer that produces light during operation; and (b) forming in an upper part of the nitride semiconductor multilayer film a ridge stripe that has a front end facet and a rear end facet facing the front end facet and serves as an optical waveguide, wherein in the step (b), the ridge stripe is formed so that a distance from a lateral center of the ridge stripe to a lateral center of the recess, the stepped portion, or the protruding portion changes continuously or in stages from the front end facet toward the rear end facet, whereby bandgap energy of the active layer is changed continuously or in stages from the front end facet toward the rear end facet.

According to this method, the bandgap energy of the active layer can be changed from the front end facet toward the rear end facet by changing the distance from the lateral center of the ridge stripe to the lateral center of the recess, the stepped portion, or the protruding portion continuously or in stages from the front end facet toward the rear end facet in the step (b). Thus, luminous efficiency can be improved while increasing an emission spectrum width. Moreover, the semiconductor light-emitting element can be manufactured without increasing the number of steps as compared to conventional semiconductor light-emitting elements having a ridge stripe. This can prevent a significant increase in manufacturing cost.

According to the example embodiments described above, a semiconductor light-emitting element can be implemented which has a large emission wavelength width and high luminous efficiency.

DETAILED DESCRIPTION

An embodiment of the present invention will be specifically described below.

(Embodiment)

A semiconductor light-emitting element and a manufacturing method thereof according to an embodiment of the present invention will be described below with reference to the accompanying drawings. A blue-violet SLD (peak emission wavelength: 405 nm) using a hexagonal GaN-based semiconductor is herein described as an example of the semiconductor light-emitting element.

Figure 1A:
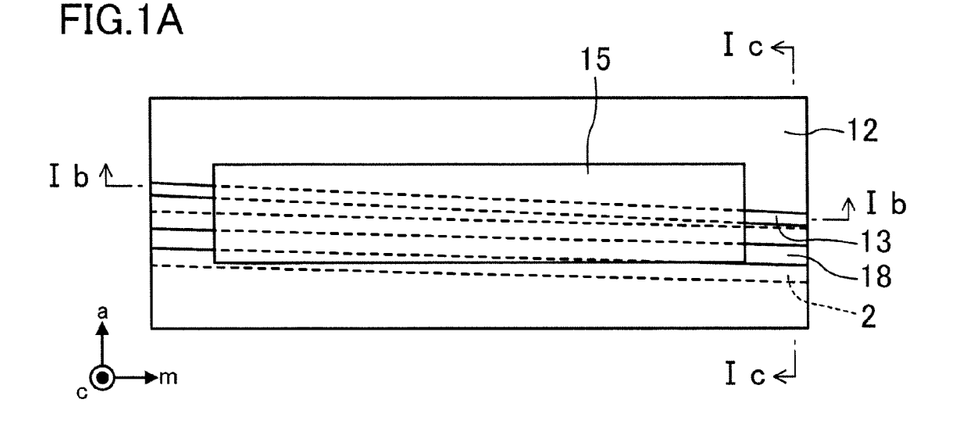
FIGS. 1A-1C are diagrams showing a blue-violet SLD according to an embodiment of the present invention.
Figure 1B:
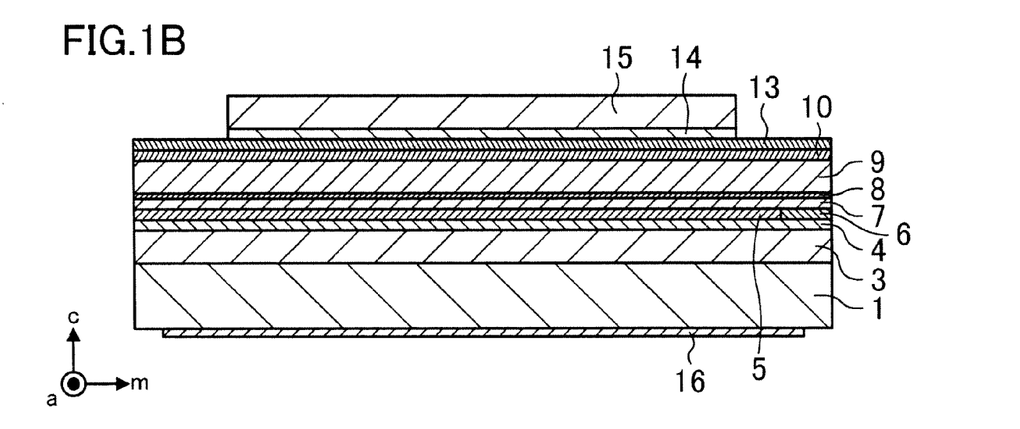
Figure 1C:
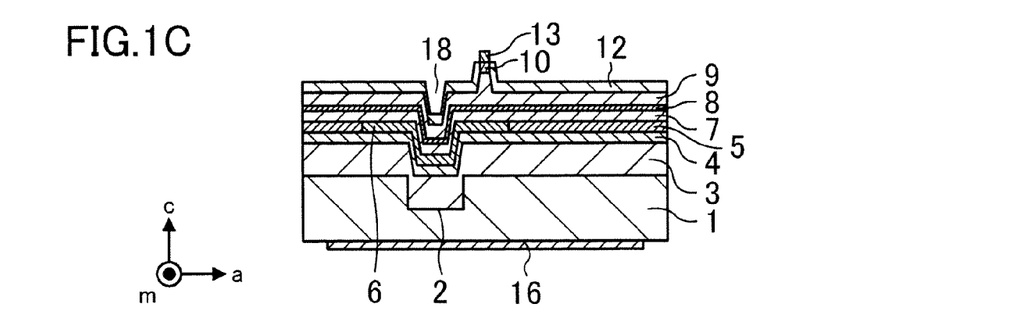

FIGS. 1A-1C are diagrams showing the blue-violet SLD according to the embodiment of the present invention. FIG. 1A is a plan view of the SLD of the present embodiment as viewed from above a substrate. FIG. 1B is a cross-sectional view of the SLD taken along line Ib-Ib in FIG. 1A in a direction perpendicular to the plane of the paper of the figure. FIG. 1C is a cross-sectional view of the SLD (a view of the SLD as viewed from a direction in which light is emitted) taken along line Ic-Ic in FIG. 1A in the direction perpendicular to the plane of the paper of the figure. FIG. 1C shows a cross section of the SLD near a light-emitting end facet, and does not show a wiring electrode 14 and a pad electrode 15 that are seen behind. In FIGS. 1A-1C, "c," "a," and "m" represent plane orientations of hexagonal GaN-based crystal. "c" represents a normal vector to a (0001) plane, namely a c-axis, "a" represents a normal vector to a (11-20) plane and a plane equivalent thereto, namely an a-axis, and "m" represents a normal vector to a (1-100) plane and a plane equivalent thereto, namely an m-axis. In the specification, for convenience, a negative sign "−" in Miller indices of the plane orientations represents inversion of an index following the negative sign "−."

As shown in FIGS. 1A-1C, the SLD of the present embodiment includes a substrate 1, an N-type cladding layer 3 comprised of $Al_{0.03}Ga_{0.97}N$, an N-side optical guide layer 4 comprised of GaN, an active layer 6, a P-side optical guide layer 7 comprised of GaN, an overflow suppressing layer (OFS layer) 8 comprised of $Al_{0.20}Ga_{0.80}N$, a P-type cladding layer 9, a P-type contact layer 10 comprised of GaN, a P-side electrode 13, a wiring electrode 14 comprised of a metal, a pad electrode 15, and an N-side electrode 16. The N-type cladding layer 3, the N-side optical guide layer 4, the active layer 6, the P-side optical guide layer 7, the OFS layer 8, the P-type cladding layer 9, the P-type contact layer 10, the P-side electrode 13, the wiring electrode 14, and the pad electrode 15 are sequentially formed in this order on the upper surface of the substrate 1. The N-side electrode 16 is formed on the lower surface of the substrate 1.

That is, a group-III (group-13 according to the current International Union of Pure and Applied Chemistry (IUPAC) classification) nitride semiconductor multilayer film including the N-type cladding layer 3, the N-side optical guide layer 4, the active layer 6, the P-side optical guide layer 7, the OFS layer 8, the P-type cladding layer 9, and the P-type contact layer 10 is provided on the substrate 1 or a semiconductor layer. The substrate 1 is comprised of, e.g., hexagonal GaN, and has a (0001) principal surface (upper surface). An insulating film (a passivation film) 12 comprised of $SiO_2$ covers the upper surface of the P-type cladding layer 9.

The P-type cladding layer 9 has a strained superlattice structure having a thickness of 0.48 µm. This strained superlattice structure has 160 repeated cycles of an $Al_{0.16}Ga_{0.84}N$ layer with a thickness of 1.5 nm and a GaN layer with a thickness of 1.5 nm.

The thickness of the N-type cladding layer 3 is, e.g., about 2 µm, the thickness of the N-side optical guide layer 4 is, e.g., about 0.1 µm, the thickness of the P-side optical guide layer 7 is, e.g., about 0.1 µm, the thickness of the OFS layer 8 is, e.g., about 10 nm, and the thickness of the P-type contact layer 10 is, e.g., about 0.05 µm.

The distance from the light-emitting end facet (the right end in FIG. 1A; the front end facet) to the rear end facet (the left end in FIG. 1A), namely the chip length of the SLD, is, e.g., 800 µm.

The active layer 6 has an alternate stack of a barrier layer comprised of $In_{0.02}Ga_{0.98}N$ and a quantum well layer comprised of $In_{0.06}Ga_{0.94}N$. The active layer 6 has, e.g., three cycles of the quantum well layer.

In the SLD of the present embodiment, an optical waveguide, which is formed by the N-type cladding layer 3, the N-side optical guide layer 4, the active layer 6, the P-side optical guide layer 7, the OFS layer 8, the P-type cladding layer 9, and the P-type contact layer 10, is formed in the nitride semiconductor multilayer film.

A recess, a stepped portion, or a protruding portion is formed in the substrate 1. In the example shown in FIG. 1C, a recess 2 (shown by broken line in FIG. 1A) is formed in the upper surface of the substrate 1, and a recess 18 smaller than the recess 2 is formed in the upper surface of the nitride semiconductor multilayer film due to the recess 2. The recess 2 has a width of, e.g., about 30 µm and a depth of, e.g., about 2 µm.

A direction in which light propagates through the optical waveguide (a direction in which the recesses 2, 18 extend as shown in FIG. 1A) is tilted at, e.g., about 9° with respect to a normal (the m-axis) to the light-emitting end facet shown in FIG. 1C.

A part of the P-type cladding layer 9 (the upper part of the nitride semiconductor multilayer film) forms a stripe region (a ridge stripe) protruding in a stripe pattern, and the P-type contact layer 10 is formed on the stripe region. This ridge stripe forms a part of the optical waveguide. The P-side electrode 13 on the P-type contact layer 10 is also formed in a stripe pattern. This stripe region is tilted at 10° with respect to the m-axis direction (see FIG. 1A). Since the tilt angle of the stripe region with respect to the m-axis direction is slightly larger than that of the recess 2 with respect to the m-axis direction, the distance from the center of the stripe region to an end of the recess 2 is continuously increased from the light-emitting end facet (the front end facet) toward the rear end facet. This distance is, e.g., 5 µm in the light-emitting end facet, and, e.g., 15 µm in the rear end facet. In the above structure and growth conditions used by the inventor, the emission wavelength hardly changes if this distance is 20 µm or more. However, the range in which the emission wavelength of the active layer changes varies in other structures and growth conditions, the distance and the tilt angle that are used to carry out the present invention are not limited to the values described above.

In addition to the case shown in FIGS. 1A-1C, the distance from the center of the stripe region (the ridge strip) to the end of the recess 2 (the stepped portion or the protruding portion if the stepped portion or the protruding portion is formed instead of the recess) may be increased in stages from the light-emitting end facet (the front end facet) toward the rear end facet, as described below. In either case, the distance between the centerline connecting the lateral centers of the recess 2 and the lateral center of the ridge stripe need only change continuously or in stages from the front end facet toward the rear end facet.

The manufacturing method of the SLD according to the present embodiment will be described below with reference to FIGS. 1A-1C.

First, a $SiO_2$ film is deposited with a thickness of about 600 nm on the upper surface of the substrate 1 by a thermal chemical vapor deposition (CVD) method using, e.g., $SiH_4$ as a source material. The substrate 1 is comprised of N-type hexagonal GaN, and has a (0001) principal surface (upper surface).

Next, the $SiO_2$ film is partially removed by photolithography so that the removed portion of the $SiO_2$ film has a stripe pattern. The longer side of the removed portion is tilted at, e.g., 9° with respect to the m-axis, and the removed portion has a width of 30 µm. Then, by an inductively coupled plasma (ICP) etching apparatus using $CF_4$, a region of the substrate 1 from which the $SiO_2$ film has been removed is etched to the depth of about 2 µm to form the recess 2 in the upper part of the substrate 1. In this step, the recess 2 may be formed by performing etching under different conditions from those described above. Various etching methods capable of forming a recess in a substrate, such as using a different kind of gas, may be used to form the recess 2. Thereafter, the $SiO_2$ film is removed by using hydrofluoric acid. The recess need not necessarily be formed in the upper part of the substrate 1. Instead of the recess, a stepped portion or a protruding portion may be formed in the upper part of the substrate 1.

Then, the N-type cladding layers 3 comprised of N-type $Al_{0.03}Ga_{0.97}N$ is grown with a thickness of about 2 µm on the upper surface of the substrate 1 by, e.g., a metalorganic chemical vapor deposition (MOCVD) method. The following nitride semiconductors are also formed by the MOCVD method etc.

Subsequently, an N-type GaN layer as the N-type optical guide layer 4 is grown with a thickness of about 0.1 µm on the N-type cladding layer 3. A barrier layer comprised of $In_{0.02}Ga_{0.98}N$ and a quantum well layer comprised of $In_{0.06}Ga_{0.94}N$ are alternately stacked on the N-side optical guide layer 4 to form the active layer 6 including three cycles of the quantum well layer. At this time, "Eg1<Eg2," where "Eg1" represents bandgap energy in a region 5 of the active layer 6 which is located away from the recess 2, and "Eg2" is bandgap energy in a region of the active layer 6 which is located near the recess 2.

Then, the P-side optical guide layer 7 comprised of P-type GaN is grown with a thickness of about 0.1 μm on the active layer 6. Thereafter, the OFS layer 8 comprised of P-type $Al_{0.20}Ga_{0.80}N$ is grown with a thickness of about 10 nm on the P-side optical guide layer 7. Subsequently, 160 cycles of an $Al_{0.16}Ga_{0.84}N$ layer with a thickness of about 1.5 nm and a GaN layer with a thickness of about 1.5 nm are repeatedly deposited on the OFS layer 8 to form the P-type cladding layer 9 comprised of a strained superlattice and having an overall thickness of 0.48 μm.

Then, the P-type contact layer 10 comprised of P-type GaN is grown with a thickness of about 0.05 μm on the P-type cladding layer 9. The above nitride semiconductor layers are also grown on the recess 2 (or the stepped portion) provided in the substrate 1. However, since the nitride semiconductor layers are grown so as to bury the recess 2, the width and depth of the recess 18 that is formed in the upper surface of the P-type contact layer 10 may be smaller than those of the recess 2. Depending on the growth conditions of the nitride semiconductor layer, the recess 2 may be completely buried and be flat after the growth of the active layer 6. Even in this case, the advantages of the present embodiment can be obtained if a recess remains in a layer immediately before the growth of the active layer 6 or in the upper surface of the active layer 6 due to the recess 2 provided in the substrate 1, and the emission wavelength of the active layer 6 is shorter than in the case where no recess is provided.

The reason why the emission wavelength of the active layer changes due to the recess (or the stepped portion) 2 is described in PCT International Publication No. WO/2009/057254.

That is, the manufacturing method of the present embodiment uses a phenomenon in which in GaN-based mixed crystal growth, the off angle of a growth plane affects the composition. For example, it is known that, in the case of growing a mixed crystal of indium gallium nitride (InGaN) on a (0001) plane of a substrate comprised of GaN, the In composition significantly decreases as the off angle with respect to the (0001) plane increases.

If a GaN-based mixed crystal is grown on a substrate having a recess, a stepped portion, or a protruding portion, the crystal plane is tilted near the recess, the stepped portion, or the protruding portion, and the off angle changes. Thus, the area of the region where the off angle changes and the off angle can be controlled by adjusting the depth or height and the shape of the recess, the stepped portion, or the protruding portion. In other words, the composition ratio of the GaN-based mixed crystal, for example, the In composition in InGaN, changes according to the off angle, and the bandgap can be controlled to a desired value.

In the SLD of the present embodiment, since the active layer 6 is formed on the nitride semiconductor layer (the N-side optical guide layer 4) having a recess resulting from the recess 2 (or the stepped portion or the protruding portion), the In composition in the quantum well layer forming the active layer 6 changes within the layer. Accordingly, as described below, the FWHM of the emission wavelength is significantly increased as compared to the case where the recess 2 or the stepped portion is not provided.

The phenomenon in which the composition of the nitride semiconductor to be formed changes according to the off angle applies not only to InGaN, and can be used to implement the configuration of the present embodiment. For example, if the Al composition changes in a GaN-based semiconductor containing Al, this can be considered due to a phenomenon similar to that in the case of using InGaN.

In addition to the MOCVD method, other growth methods capable of growing a nitride-based blue-violet semiconductor laser structure, such as a molecular beam epitaxy (MBE) method and a chemical beam epitaxy (CBE) method may be used as a method for crystal growth of the active layer 6. For example, regarding the source materials in the MOCVD method, trimethylgallium can be used as a Ga source material, trimethylindium can be used as an In source material, trimethylaluminum can be used as a Al source material, ammonia can be used as an N source material, silane gas can be used as a Si source material as an N-type impurity, bis(cyclopentadienyl) magnesium may be used as a Mg source material as a P-type impurity.

Subsequently, a $SiO_2$ film is formed with a thickness of about 0.3 μm by using, e.g., a thermal CVD method. By using a photoresist, the $SiO_2$ film is partially removed by photolithography so that a stripe region having a width of 1.5 μm is left. In this manner, the upper surface of the nitride semiconductor multilayer film is exposed except for the stripe region. The nitride semiconductor multilayer film is a film including the N-type cladding layer 3, the N-side optical guide layer 4, the active layer 6, the P-side optical guide layer 7, the OFS layer 8, the P-type cladding layer 9, and the P-type contact layer 10.

Unlike the semiconductor light-emitting element described in PCT International Publication No. WO/2009/057254, the stripe region formed in this step is tilted at about 10° with respect to the m-axis direction. In the case of dividing the SLD into individual chips (chip length: 800 μm) in a later step, alignment is performed in the photolithography so that the distance from the center of the stripe region to the end of the recess 2 is 5 μm in the front end facet as the light-emitting end facet of the chip, and is 15 μm in the rear end facet of the chip. That is, the stripe region is formed so that the distance from the center of the stripe region to the end of the recess 2 changes continuously or in stages from the front end facet toward the rear end facet. Then, by using ICP etching, the nitride semiconductor multilayer film (the P-type contact layer 10 and the P-type cladding layer 9) are etched to the depth of about 0.35 μm to form a ridge stripe.

Thereafter, the $SiO_2$ film is removed by using hydrofluoric acid, and then a $SiO_2$ film is again formed with a thickness of about 200 nm over the entire upper surface of the substrate (the SLD being fabricated) by using a thermal CVD method.

Then, by using photolithography, an opening having a width of 1.3 μm is formed in a portion of a photoresist which is located on the top of the ridge stripe.

Subsequently, by using, e.g., the photoresist as a mask, the $SiO_2$ film in the opening is removed by a reactive ion etching (RIE) apparatus using $CHF_3$ gas. Then, a Pd film having a thickness of 40 nm and a Pt film having a thickness of 35 nm are sequentially vapor deposited as a P-side electrode material film on the $SiO_2$ film by using, e.g., an electron beam (EB) deposition apparatus. Thereafter, the P-side electrode material film other than a portion of the P-side electrode material film which is formed on the top of the ridge stripe is removed by a liftoff method to form the P-side electrode 13.

Moreover, the wiring electrode 14 is formed so as to cover the ridge stripe. The wiring electrode 14 has a length of 500 μm in a direction in which the ridge stripe extends, and a width of 150 μm in a direction perpendicular to the ridge stripe. The wiring electrode 14 is comprised of Ti/Pt/Au films (thickness: 50 nm, 200 nm, and 100 nm, respectively) which are sequentially stacked from bottom to top, and is formed by using photolithography as in the case of the P-side electrode 13.

When dividing the SLD into individual chips, cutting the wiring electrode 14 may separate the P-side electrode 13, which is in close contact with the wiring electrode 14, from the P-type contact layer 10. Accordingly, it is desirable that the wiring electrode 14 before cutting be not connected between adjoining SLDs. Subsequently, the thickness of the Au film is increased to 10 μm by electrolysis plating (the pad electrode 15). This allows the SLD to be mounted by wire bonding via the pad electrode 15, and also allows heat generated in the active layer 6 to be effectively dissipated, whereby reliability of the SLD can be improved.

Thereafter, the back surface of the substrate 1 is polished with diamond slurry to reduce the thickness of the substrate 1 to about 100 and then Ti/Pt/Au films having a thickness of 5 nm, 10 nm, and 1,000 nm, respectively, are formed as the N-side electrode 16 on the back surface of the substrate 1 by using, e.g., an EB deposition method.

Then, the SLD in the form of a wafer is primarily cleaved along the m-plane so as to have a length of about 800 μm in the m-axis direction. At this time, the cleavage is performed so that the distance from the lateral center of the ridge stripe to the end of the recess 2 is, e.g., 5 μm in one end (a front end facet) of the primary cleavage plane and is, e.g., 15 μm in the other end (a rear end facet) of the primary cleavage plane. Then, the SLD is secondarily cleaved along the a-plane so as to have a length of 200 μm in the lateral direction. The SLD of the present embodiment is manufactured in this manner.

Operation of the SLD manufactured as described above will be described below.

In the SLD of the present embodiment, electrons injected from the N-side electrode 16 and holes injected from the P-side electrode 13 recombine with each other in the active layer 6, and spontaneous emission light produced by this recombination is amplified with high gain due to stimulated emission while traveling in a direction toward the light-emitting end facet, and is emitted from the light-emitting end facet. Since the direction in which the ridge stripe forming the optical waveguide extends (an optical-axis direction of the optical waveguide) is tilted with respect to the normal to the light-emitting end facet, the possibility is reduced that an optical cavity is formed by end facet reflection. Therefore, no laser oscillation in the Fabry-Perot (FP) mode occurs, and the semiconductor light-emitting element of the present embodiment functions as an SLD.

Figure 2A:
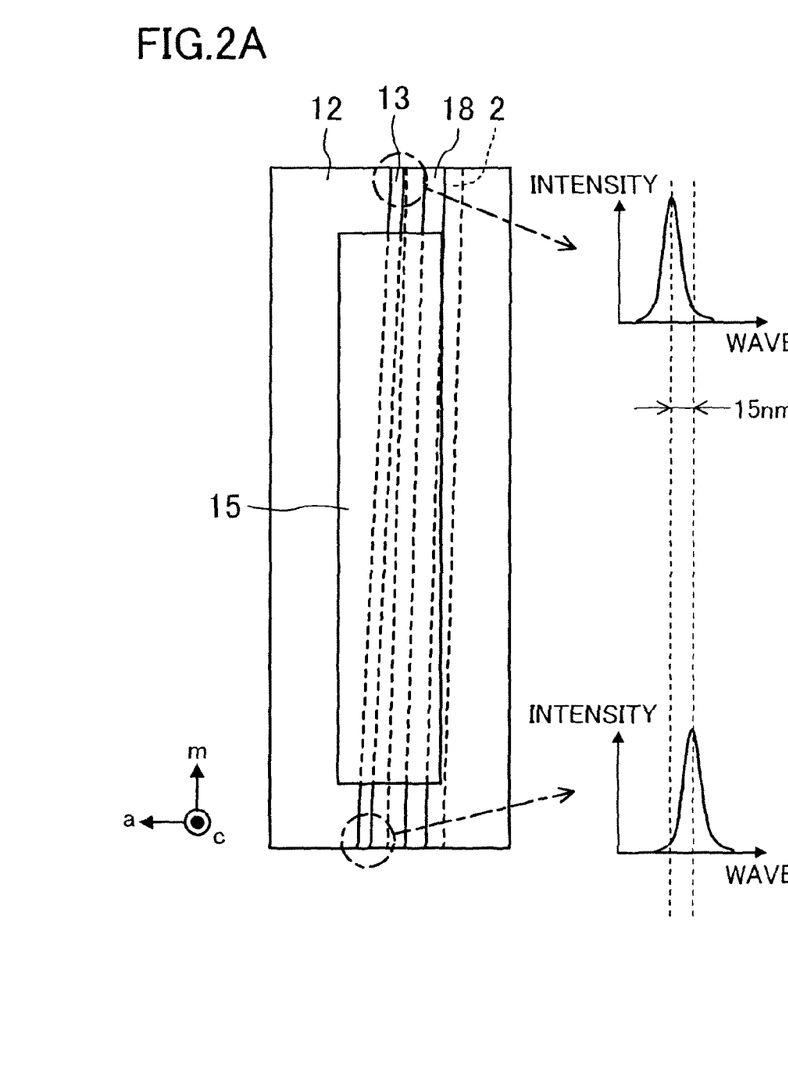
FIG. 2A is a diagram schematically showing emission spectrums of spontaneous emission light near front and rear end facets of a ridge stripe in the SLD according to the embodiment.
Figure 2B:
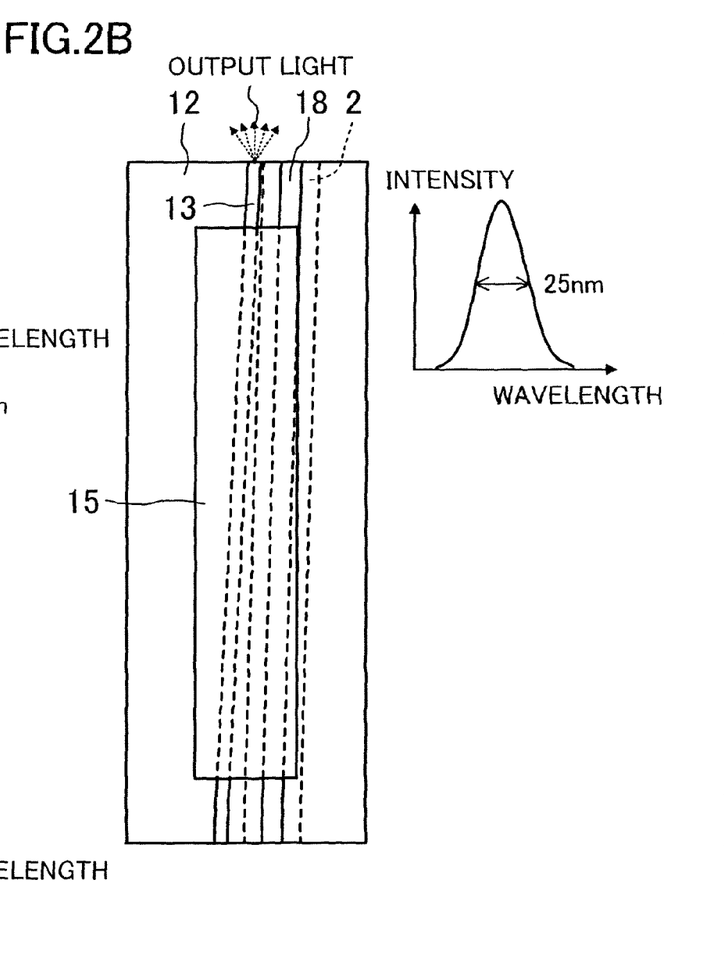
FIG. 2B is a diagram schematically showing a wavelength spectrum of light that is emitted from a front end facet of the SLD.

FIG. 2A is a diagram schematically showing emission spectrums of spontaneous emission light near the front and rear end facets of the ridge stripe in the SLD of the present embodiment. FIG. 2B is a diagram schematically showing a wavelength spectrum of light that is emitted from the front end facet of the SLD of the present embodiment.

In a region near the front end facet as the light-emitting end facet, the active layer 6 below the ridge stripe is located at a distance of 5 μm from the recess 2. Thus, as described in PCT International Publication No. WO/2009/057254, the peak wavelength of the spontaneous emission light in the active layer is 390 nm in this region, which is shorter by about 15 nm than the value (405 nm) in the active layer located away from the stepped portion (see FIG. 2A). On the other hand, in a region near the rear end facet, the active layer below the ridge stripe is located at a distance of 15 μm from the recess 2. Thus, the peak wavelength of the spontaneous emission light in the active layer remains at 405 nm in this region. The bandgap energy of the active layer 6 below the ridge stripe changes continuously or in stages between the front end facet and the rear end facet.

Thus, since the optical gain peak wavelength is 390 nm near the front end facet and is 405 nm near the rear end facet, the FWHM of the wavelength spectrum of the light emitted from the front end facet can be increased to about 25 nm, as shown in FIG. 2B. In this case, the wavelength range of the emission light can be increased as compared to the case where the direction in which the recess 2 extends is substantially parallel to that in which the ridge stripe extends (FWHM: 10 nm).

The increase in emission spectrum width in the SLD of the present embodiment depends on the shape and height of the recess 2 or the stepped portion, and the growth conditions. In principle, an active layer, which is comprised only of a GaN layer and does not contain In in a well layer and a barrier layer, can be formed near the front end facet. In this case, the optical gain peak wavelength is 365 nm, and in theory, the emission spectrum width can be increased to 50 nm. In the case where the recess or the stepped portion is not formed, and crystal growth is performed so that the emission wavelength of the active layer is increased from 405 nm to, e.g., 420 nm, the optical gain peak wavelength is 365 nm near the front end facet and is 420 nm near the rear end facet. Thus, the emission spectrum width is 65 nm.

In the SLD of the present embodiment, the distance between the recess 2 and the lateral center of the ridge stripe is controlled so that the bandgap energy of the active layer 6 is high near the front end facet and is low near the rear end facet. Thus, guided light that is produced near the rear end facet and propagates toward the front end facet is hardly absorbed by the active layer 6 near the front end facet, and is emitted from the front end facet. On the contrary, guided light that is produced near the front end facet and propagates toward the rear end facet is absorbed by the active layer near the rear end facet. The absorbed light forms electron-hole pairs in the active layer. Since quantum energy of the electron-hole pairs is higher than the bandgap energy of the active layer, the electrons recombine with the holes, thereby contributing to optical gain (so-called "photon recycling effect"). That is, an optical component that propagates to the rear end facet is converted to an optical component that propagates to the front end facet by the photon recycling effect. As a result, optical output that is emitted from the rear end facet and thus cannot be effectively used in the conventional optical waveguide structures is emitted from the front end facet. Accordingly, improved luminous efficiency, which is about twice as high as that of the conventional optical waveguide structures, can be achieved in the SLD of the present embodiment.

The step of forming the ridge stripe tilted with respect to the normal to the light-emitting end facet is different only in the mask shape from the step of forming a ridge stripe having a conventional shape. Thus, the number of steps is not increased. Accordingly, the manufacturing method of the present embodiment can implement the SLD having an increased emission spectrum without increasing the manufacturing cost, as compared to a method in which a reflective mirror etc. is separately provided.

In the SLD of the present embodiment described above, the distance from the lateral center of the ridge stripe to the end (or the center) of the recess 2 changes continuously or in stages from the front end facet toward the rear end facet. In this case, the recess is formed in the active layer 6 or the layer that contacts the lower surface of the active layer 6. At this time, the distance from the lateral center of the ridge stripe to the end of the recess formed in the active layer 6 or the layer that contacts the lower surface of the active layer 6 changes continuously or in stages.

Modifications of SLD of Embodiment

Figure 3A:
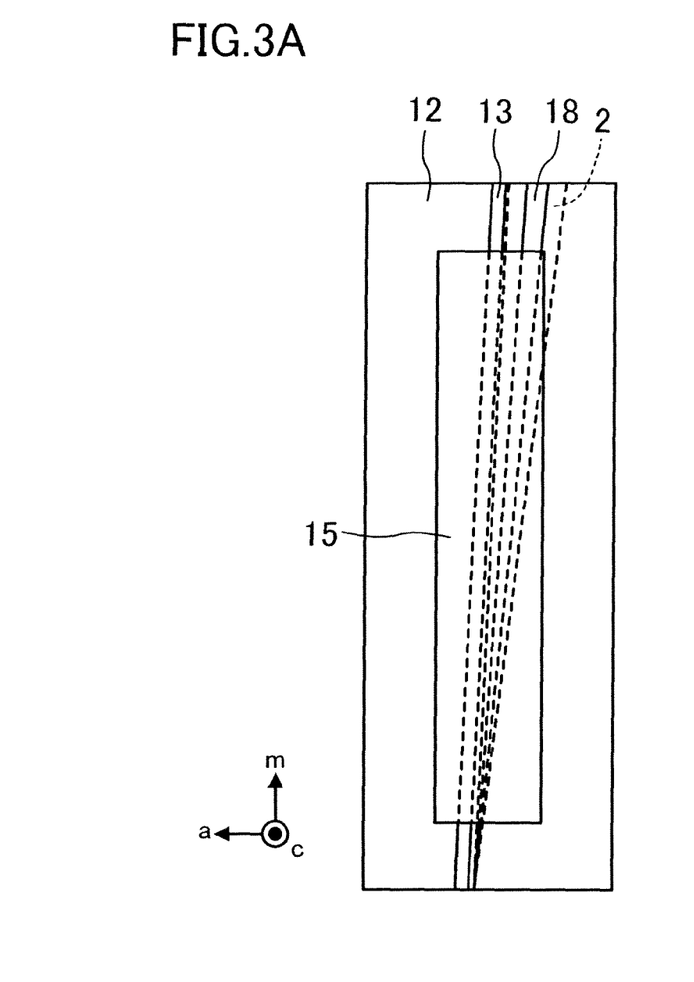
FIG. 3A is a plan view showing a first modification of the SLD according to the embodiment.
Figure 3B:
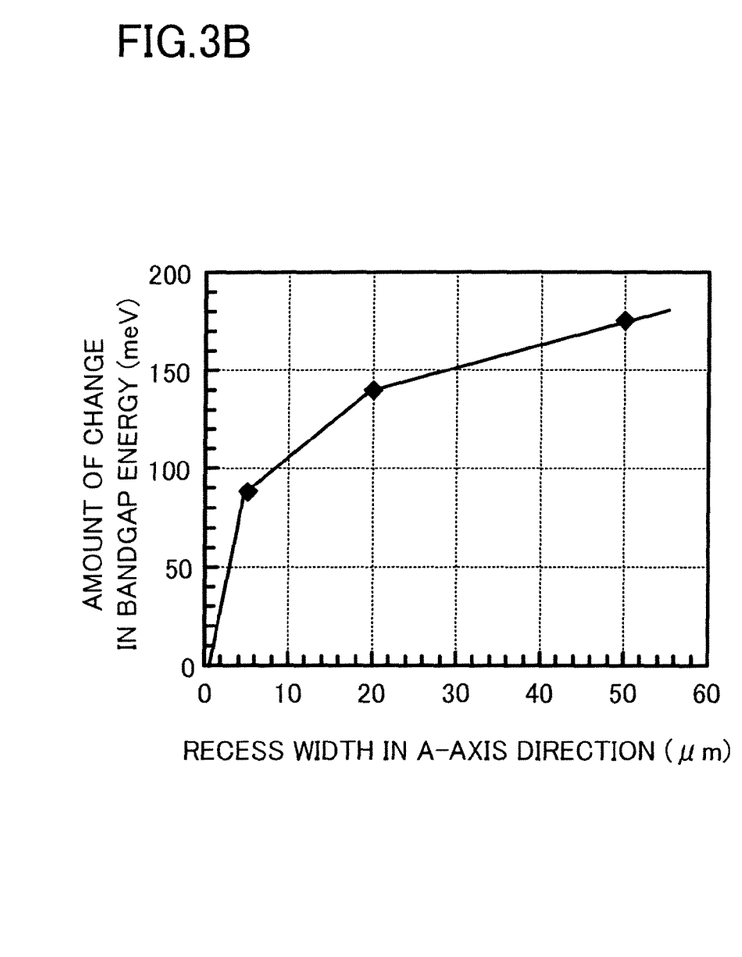
FIG. 3B is a graph showing a relation between the width of a recess 2 in an a-axis direction and the amount of change in bandgap energy in the SLD according to the modification.

FIG. 3A is a plan view showing a first modification of the SLD according to the present embodiment, and FIG. 3B is a graph showing a relation between the width (in the a-axis direction) of the recess 2 and the amount of change in bandgap energy in the SLD according to this modification.

In the SLD according to the first modification shown in FIG. 3A, the recess 2 whose width (specifically, the width in a direction substantially perpendicular to the direction in which the ridge stripe extends) decreases from the front end facet toward the rear end facet is provided in the substrate 1 as a structure that continuously changes the optical gain peak wavelength with respect to the position in the ridge stripe.

For example, the distance from the center of the ridge stripe in the a-axis direction (more specifically, the direction perpendicular to the direction in which the ridge stripe extends) to the end of the recess 2 is 5 μm as in the SLD shown in FIGS. 1A-1C. However, the width of the recess 2 changes gradually so that the width of the recess 2 is 50 μm in the front end facet and is 0 μm in the rear end facet. In this case as well, the distance between the centerline of the recess 2 in a direction perpendicular to the a-axis direction and the center of the ridge stripe in the a-axis direction decreases from the front end facet toward the rear end facet.

As shown in FIG. 3B, the amount of change in bandgap energy of the active layer 6 increases as the width of the recess 2 in the a-axis direction increases. As described above, this is because the nitride semiconductor composition in the active layer 6 changes according to the width of the recess 2.

Thus, the bandgap energy of the active layer 6 can also be controlled by controlling the width of the recess 2, and the width of the emission spectrum can be increased as in the example of FIGS. 1A-1C. In the example of FIG. 3B, since the bandgap energy increases to 175 meV near the front end facet, the optical gain peak wavelength decreases from 405 nm to 383 nm. The bandgap energy does not change near the rear end facet, and the optical gain peak wavelength remains at 405 nm. Thus, the emission spectrum width can be increased from 10 nm to 28 nm as compared to the case where the recess 2 or the stepped portion is not formed.

Similar advantages can be obtained even if a stepped portion or a protruding portion is formed in the active layer 6 or the layer that contacts the lower surface of the active layer 6, instead of the recess 2.

Figure 4A:
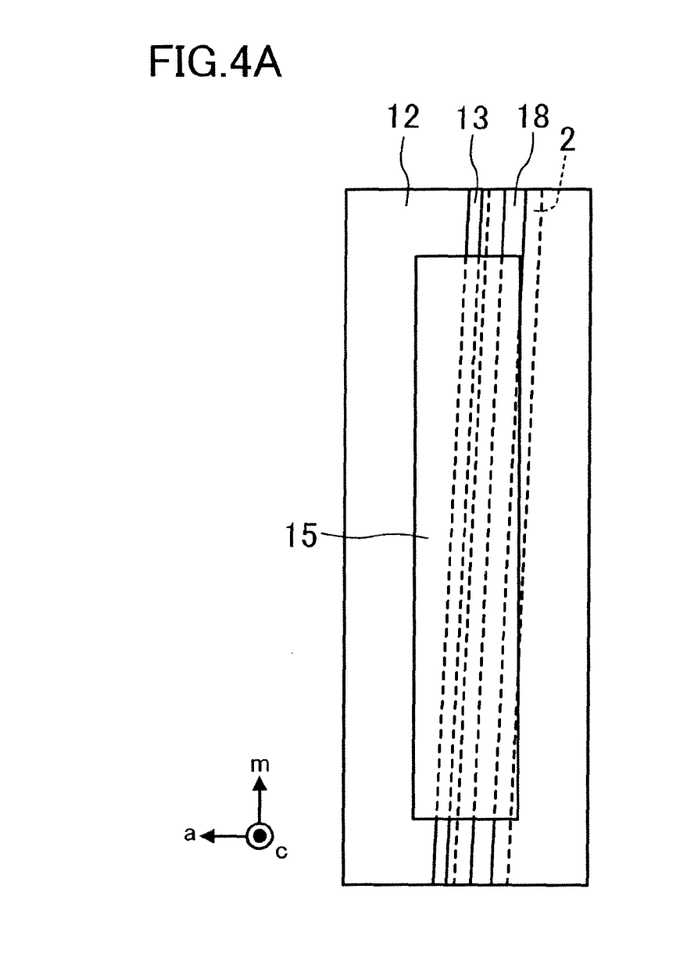
FIG. 4A is a plan view showing a second modification of the SLD according to the embodiment.
Figure 4B:
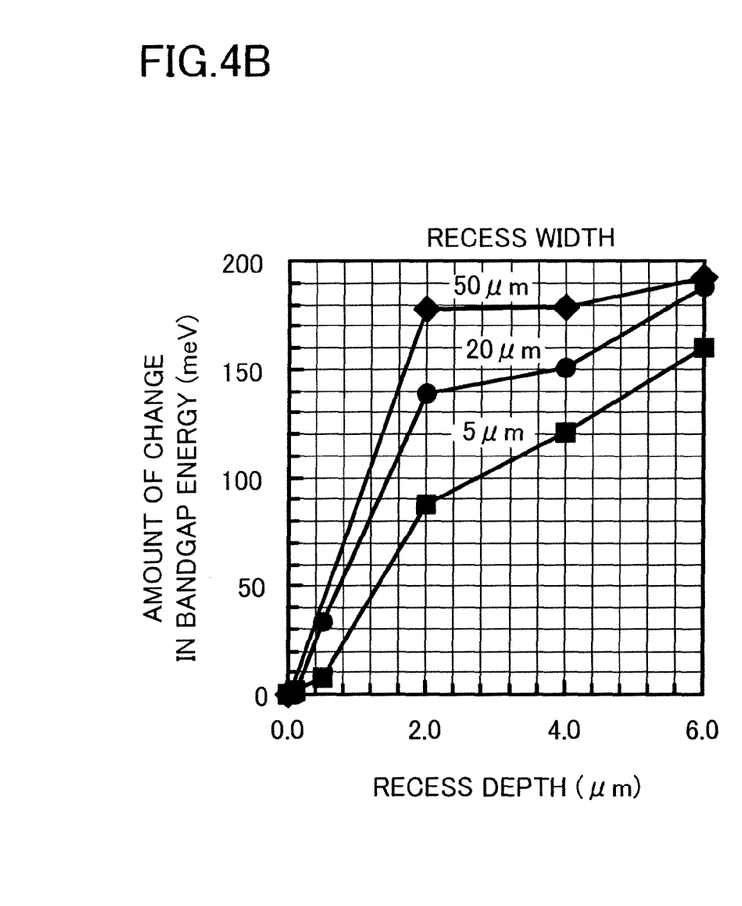
FIG. 4B is a graph showing a relation between the depth of the recess 2 and the amount of change in bandgap energy in the SLD according to the modification.

FIG. 4A is a plan view showing a second modification of the SLD according to the present embodiment, and FIG. 4B is a graph showing a relation between the depth of the recess 2 and the amount of change in bandgap energy in the SLD according to this modification.

In the SLD according to the second modification shown in FIG. 4A, the distance between the lateral center of the ridge stripe and the end of the recess 2 is 5 μm as in the SLD according to the first modification. However, the recess 2 is formed so that the depth of the recess 2 changes gradually so that the depth of the recess 2 is 2 μm in the front end facet as the light-emitting end facet and is substantially 0 μm in the rear end facet.

As shown in FIG. 4B, in the case where the recess 2 has a constant width, the amount of change in bandgap energy increases as the depth of the recess 2 increases. It can be seen from the figure that this relation is satisfied when the width of the recess 2 is any of 5 μm, 20 μm, and 50 μm.

Thus, the bandgap energy of the active layer 6 can also be controlled as appropriate by continuously changing the depth of the recess 2 from a position near the front end facet toward a position near the rear end facet. Accordingly, advantages similar to those of the SLD of FIGS. 1A-1C can be obtained by the SLD of this modification.

That is, in the case where the recess 2 has a width of 50 μM in the a-axis direction, the bandgap increases to about 175 meV near the front end facet. Thus, the optical gain peak wavelength decreases from 405 nm to 383 nm. On the other hand, the bandgap does not change near the rear end facet, and the optical gain peak wavelength remains at 405 nm. Accordingly, in the SLD of this modification, the emission spectrum width can be increased from 10 nm to 28 nm as compared to the case where the recess 2 is not formed.

In this modification, the direction in which the ridge stripe and the recess 2 (the recess 18) extend is tilted at about 9-10° with respect to the normal to the light-emitting end facet (the front end facet), and the ridge stripe extends substantially parallel to the recess 2. However, as shown in FIGS. 1A-1C, the tilt with respect to the normal to the light-emitting end facet may be slightly varied between the recess 2 and the ridge stripe. As in the SLD according to the first modification shown in FIG. 3A, the width of the recess 2 may be changed continuously or in stages. The depth of the recess 2 need not necessarily be reduced continuously from the front end facet toward the rear end facet, may be reduced in stages from the front end facet toward the rear end facet. In this case, the bandgap energy of the active layer 6 is high near the front end facet, and decreases in stages toward the rear end facet.

In the SLD of this modification, the recess 2 is continuously formed along the ridge stripe from the front end facet to the rear end facet in order to continuously change the optical gain peak wavelength with respect to the position in the ridge stripe. However, in order to increase the emission spectrum width of the SLD, the recess 2 need not necessarily be continuously formed along the ridge stripe.

Instead of the recess 2, a protruding portion or a stepped portion may be formed in the substrate 1. In this case, instead of the depth of the recess, the height of the protruding portion or the depth of the stepped portion changes from the front end facet toward the rear end facet.

Figure 5:
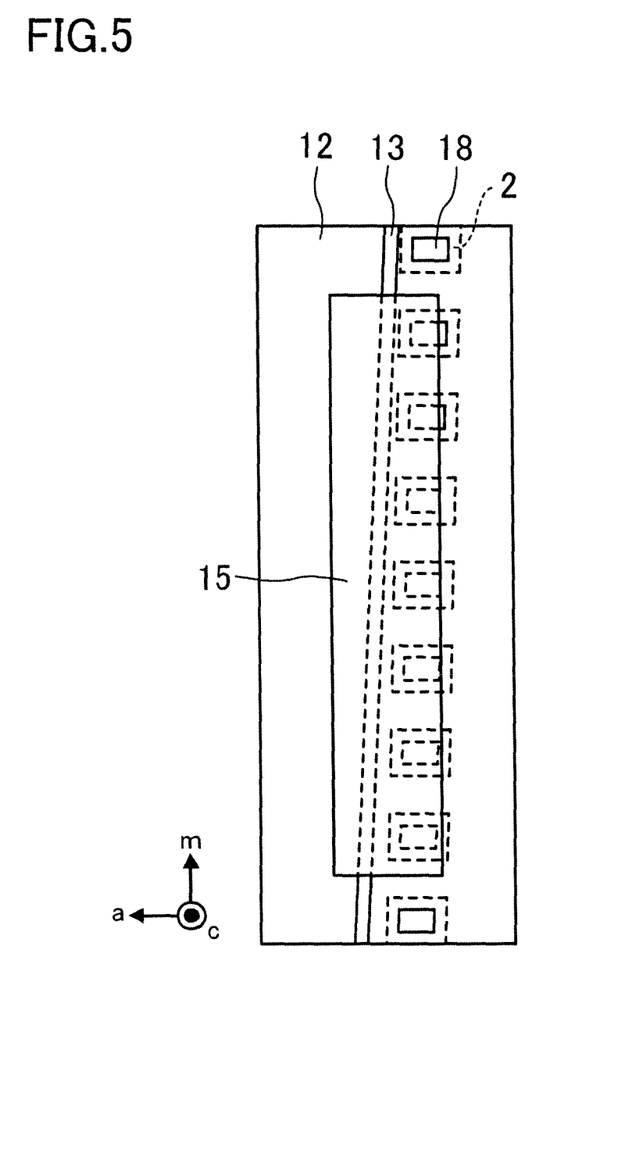
FIG. 5 is a plan view showing an SLD according to a third modification of the embodiment.

FIG. 5 is a plan view showing an SLD according to a third modification of the present embodiment. As in the SLD of this modification, a plurality of recesses 2 (stepped portions) may be discontinuously formed along the ridge stripe.

In the example shown in FIG. 5, the planar shape of the recess 2 is a parallelogram, the recess 2 has a width of 30 μm in the m-axis direction (the direction in which the ridge stripe extends), the side of the recess 2 which extends parallel to the a-axis has a length of 30 μm, and the recess 2 has a depth of 2 μm. The interval between adjoining ones of the recesses 2 (in the direction in which the ridge stripe extends) is 30 μm.

The distance between the ridge stripe and the end of the recess 2 is 5 μm in the recess 2 closest to the front end facet, and is 15 nm in the recess 2 closest to the rear end facet, and this distance is changed in stages from the front end facet toward the rear end facet. In this case as well, the emission spectrum width can be increased as in the case of FIGS. 2A-2B. In the case where the recess 2 is discontinuously provided as well, the width or depth of the recess 2 may be changed in stages from the front end facet to the rear end facet. In the SLD of this modification as well, the distance between the centerline of the recess 2 in the direction perpendicular to the a-axis direction and the center of the ridge stripe in the a-axis direction decreases from the front end facet toward the rear end facet.

Each of the SLDs of the embodiment and its modifications uses a recess or a stepped portion as a structure that is provided in the substrate in order to control the bandgap of the active layer 6. However, as described in PCT International Publication No. WO/2009/057254, a protrusion may be formed on the upper surface of the substrate 1 instead of the recess etc. In the case where the protrusion is formed on the upper surface of the substrate 1, the protrusion is formed by a method similar to the formation method of the recess 2 described above except for a mask pattern for forming the structure.

In each of the SLDs of the embodiment and its modifications described above, the recess 2 or the stepped portion is formed in the substrate 1 to form the recess or the stepped portion in the active layer 6 or the layer that contacts the lower surface of the active layer 6. However, the method of forming the stepped portion etc. in the active layer 6 is not limited to this. For example, instead of providing the stepped portion in the substrate 1, a recess, a stepped portion, or a protruding portion may be formed in the layer of the nitride semiconductor multilayer film which is located below the active layer 6, and the remaining nitride semiconductor layers including the active layer 6 may be formed over the recess, the stepped portion, or the protruding portion. A recess, a stepped portion, or a protruding portion may thus be formed in the active layer 6 or the layer that contacts the lower surface of the active layer 6.

The shapes, sizes, constituent materials, etc. of the members described above are merely an example of the embodiment, and may be changed as appropriate without departing from the spirit and scope of the present invention.

One of the SLDs of the embodiment and its modifications may be combined as appropriate with the SLDs of other embodiments or modifications in terms of the shape of the recess 2, etc. For example, the recess, the stepped portion, or the protruding portion need only be formed in the active layer 6 or the layer of the nitride semiconductor multilayer film which contacts the lower surface of the active layer 6.

In each of the embodiment or its modifications, the subject matter of the present invention is described with respect to the blue-violet SLD using a nitride semiconductor. However, the present invention is also effective in increasing the emission wavelength width and improving the luminous efficiency of the SLD using a nitride semiconductor and having an emission wavelength in a visible range such as ultraviolet, blue, or green.

Figure 7A:
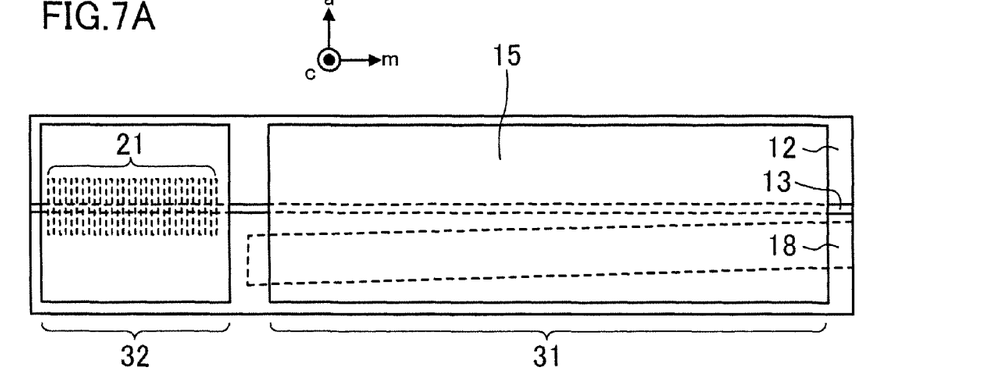
FIGS. 7A-7B are schematic diagrams showing an example in which the present invention is applied to a DBR laser.
Figure 7B:
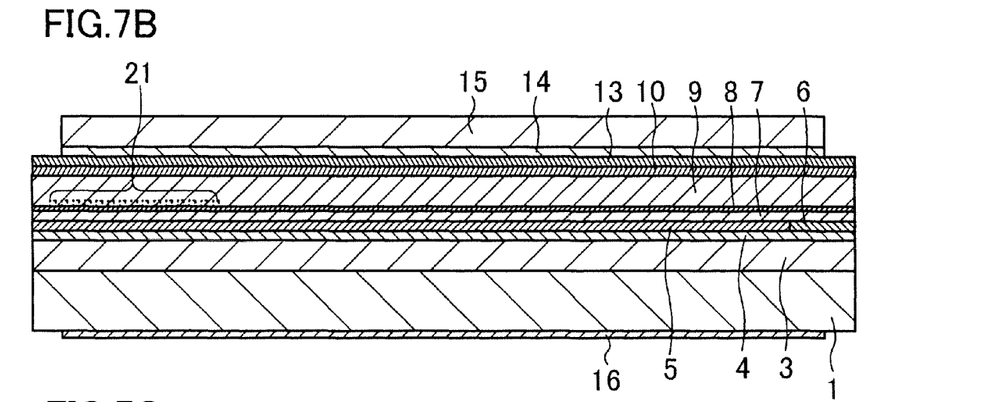
Figure 7C:
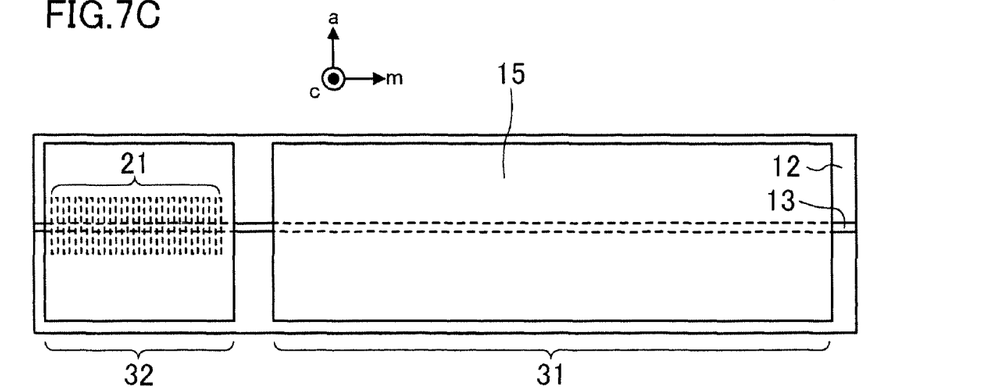
FIG. 7C is a diagram showing a comparative example fabricated for comparison and having no stepped portion.

The present invention is not limited to the SLDs, and is effective in increasing the emission wavelength width and improving the luminous efficiency of light-emitting elements using a waveguide. For example, as shown in FIGS. 7A-7C, the present invention is applicable to distributed Bragg reflector (DBR) lasers. FIGS. 7A-7B are schematic diagrams showing an example in which the present invention is applied to a DBR laser. FIG. 7C shows a comparative example fabricated for comparison. No stepped portion is provided in the comparative example.

As shown in FIGS. 7A-7B, in the DBR laser according to an example of the present invention, both the recess 18 and the P-type electrode 13 extend in the m-axis direction, and the direction in which the recess 18 extends is tilted as viewed from the m-axis direction. The DBR laser includes a gain region 31 and a DBR region 32 in which a diffraction grating 21 is formed. The DBR region 32 is placed on one side of the gain region 31 in the m-axis direction.

Figure 8A:
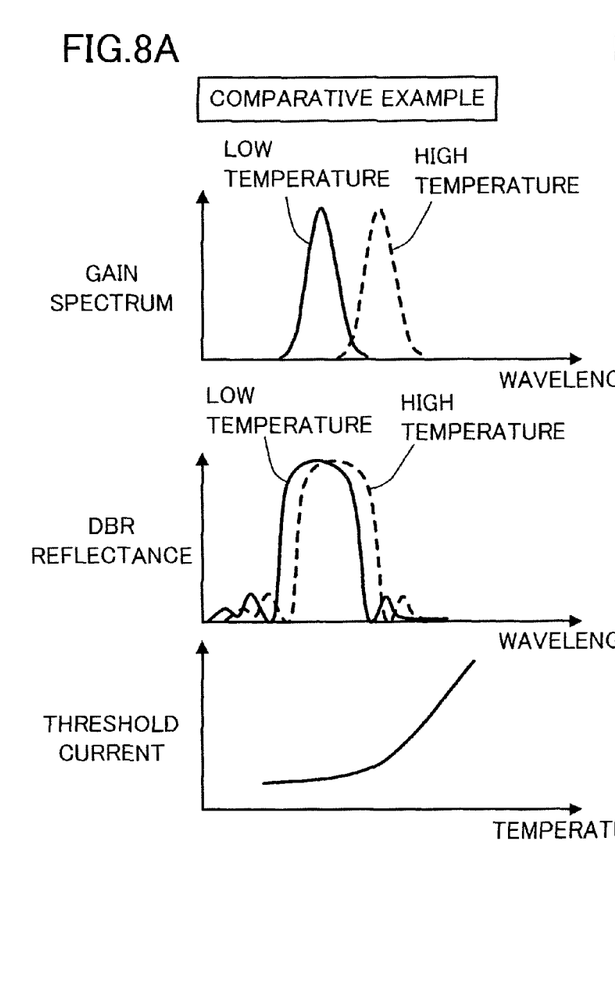
FIGS. 8A-8B show characteristics according to a comparative example and an example of the present invention, respectively.
Figure 8B:
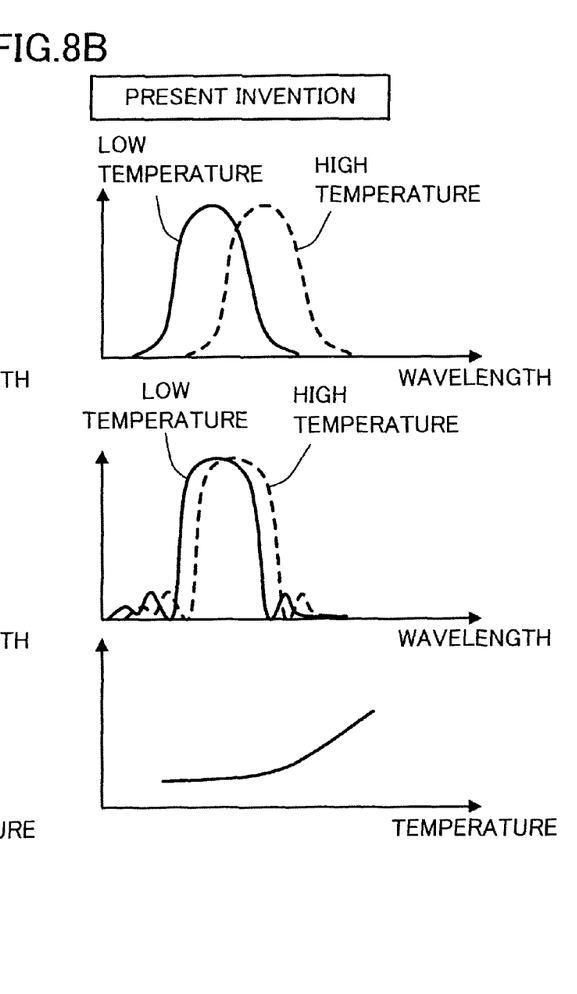

FIGS. 8A-8B show characteristics of the DBR lasers according to the comparative example and the example of the present invention, respectively. In the active layer 6 immediately below a waveguide near a stepped portion, not only a spontaneous emission spectrum is increased as described above, but also a gain spectrum is increased as shown in FIG. 8B. Accordingly, a threshold current of the DBR laser is stabilized with respect to a temperature change, as compared to the related art. In the DBR laser, net gain is determined by the product of a reflection spectrum of a DBR mirror and a gain spectrum. When the temperature rises, the refractive index of each layer increases, and the gain spectrum is shifted to longer wavelengths than the reflection spectrum (that is, the bandgap of the active layer decreases). Thus, the net gain decreases, and the threshold current increases. On the other hand, by increasing the gain spectrum according to the present invention, the net gain is less likely to decrease at the time the temperature rises, and an increase in threshold current can be suppressed.

The semiconductor light-emitting element according to the example of the present invention is useful as light sources of various apparatuses such as a laser display and an optical fiber gyroscope because of its large emission wavelength width and high luminous efficiency.

What is claimed is:

1. A semiconductor light-emitting element, comprising:
a substrate; and
a nitride semiconductor multilayer film provided on an upper surface of the substrate and including an active layer that produces light during operation, wherein
a recess, a stepped portion, or a protruding portion is formed in an active layer or a layer of the nitride semiconductor multilayer film which contacts a lower surface of the active layer,
a ridge stripe, which has a front end facet and a rear end facet facing the front end facet and serves as an optical waveguide, is formed in an upper part of the nitride semiconductor multilayer film,
a distance from a lateral center of the ridge stripe to a lateral center of the recess, the stepped portion, or the protruding portion changes continuously or in stages from the front end facet toward the rear end facet, and
bandgap energy of the active layer changes continuously or in stages from the front end facet toward the rear end facet, wherein
a depth of the recess, a depth of the stepped portion, or a height of the protruding portion changes continuously or in stages from the front end facet toward the rear end facet.

2. The semiconductor light-emitting element of claim 1, wherein
the recess, the stepped portion, or the protruding portion extends along the ridge stripe,
a distance from the lateral center of the ridge stripe to an end of the recess, the stepped portion, or the protruding portion decreases continuously from the front end facet toward the rear end facet, and
the bandgap energy of the active layer decreases continuously from the front end facet toward the rear end facet.

3. The semiconductor light-emitting element of claim 1, wherein
the recess, the stepped portion, or the protruding portion extends along the ridge stripe,
a width of the recess, the stepped portion, or the protruding portion in a direction substantially perpendicular to a direction in which the ridge stripe extends decreases continuously from the front end facet toward the rear end facet, and
the bandgap energy of the active layer decreases continuously from the front end facet toward the rear end facet.

4. The semiconductor light-emitting element of claim 1, wherein the front end facet is a light-emitting end facet, and
an optical axis of the optical waveguide is tilted with respect to a normal to the light-emitting end facet.

5. The semiconductor light-emitting element of claim 1, wherein the recess, the stepped portion, or the protruding portion is formed in the substrate.

6. A semiconductor light-emitting element, comprising:
a substrate; and
a nitride semiconductor multilayer film provided on an upper surface of the substrate and including an active layer that produces light during operation, wherein
a recess a stepped portion, or a protruding portion is formed in an active layer or a layer of the nitride semiconductor multilayer film which contacts a lower surface of the active layer,
a ridge stripe, which has a front end facet and a rear end facet facing the front end facet and serves as an optical waveguide, is formed in an upper part of the nitride semiconductor multilayer film,
a distance from a lateral center of the ridge stripe to a lateral center of the recess, the stepped portion, or the protruding portion changes continuously or in stages from the front end facet toward the rear end facet,
bandgap energy of the active layer changes continuously or in stages from the front end facet toward the rear end facet, and
multiple ones of the recess, the stepped portion, or the protruding portion are provided discontinuously along the ridge stripe.

7. The semiconductor light-emitting element of claim 6, wherein a distance from the lateral center of the ridge stripe to an end of the recess, the stepped portion, or the protruding portion decreases from the front end facet toward the rear end facet.

8. A semiconductor light-emitting element, comprising:
a substrate; and
a nitride semiconductor multilayer film provided on an upper surface of the substrate and including an active layer, wherein
a recess, a stepped portion, or a protruding portion is formed in the active layer or a layer of the nitride semiconductor multilayer film which contacts a lower surface of the active layer,
a ridge stripe, which has a front end facet and a rear end facet facing the front end facet and serves as an optical waveguide, is formed in an upper part of the nitride semiconductor multilayer film, and
a depth of the recess, a depth of the stepped portion, or a height of the protruding portion changes continuously or in stages from the front end facet toward the rear end facet.

9. The semiconductor light-emitting element of claim 8, wherein a depth of the recess, a depth of the stepped portion, or a height of the protruding portion changes continuously or in stages from the front end facet toward the rear end facet.

10. The semiconductor light-emitting element of claim 8, wherein multiple ones of the recess, the stepped portion, or the protruding portion are provided discontinuously along the ridge stripe.

11. The semiconductor light-emitting element of claim 10, wherein a distance from the lateral center of the ridge stripe to an end of the recess, the stepped portion, or the protruding portion decreases from the front end facet toward the rear end facet.

12. A method for manufacturing a semiconductor light-emitting element, comprising the steps of:
(a) providing a recess, a stepped portion, or a protruding portion in a substrate or a semiconductor layer on the substrate, and then forming on an upper surface of the substrate or an upper surface of the semiconductor layer a nitride semiconductor multilayer film including an active layer that produces light during operation; and
(b) forming in an upper part of the nitride semiconductor multilayer film a ridge stripe that has a front end facet and a rear end facet facing the front end facet and serves as an optical waveguide, wherein
in the step (b), a depth of the recess, a depth of the stepped portion, or a height of the protruding portion changes continuously or in stages from the front end facet toward the rear end facet.

13. The method of claim 12, wherein
the recess, the stepped portion, or the protruding portion extends along the ridge stripe, and
in the step (b), the ridge stripe is formed so that a distance from a lateral center of the ridge stripe to an end of the recess, the stepped portion, or the protruding portion decreases continuously from the front end facet toward the rear end facet.

14. The method of claim 12, wherein
the recess, the stepped portion, or the protruding portion extends along the ridge stripe, and
in the step (b), the ridge stripe is formed so that a width of the recess, the stepped portion, or the protruding portion in a direction substantially perpendicular to a direction in which the ridge stripe extends decreases continuously from the front end facet toward the rear end facet.

15. The method of claim 12, wherein in the step (b), the ridge stripe is formed so that a distance from a lateral center of the ridge stripe to a lateral center of the recess, the stepped portion, or the protruding portion changes continuously or in stages from the front end facet toward the rear end facet, whereby bandgap energy of the active layer is changed continuously or in stages from the front end facet toward the rear end facet.

16. A method for manufacturing a semiconductor light-emitting element, comprising the steps of:
(a) providing a recess, a stepped portion, or a protruding portion in a substrate or a semiconductor layer on the substrate, and then forming on an upper surface of the substrate or an upper surface of the semiconductor layer a nitride semiconductor multilayer film including an active layer that produces light during operation; and
(b) forming in an upper part of the nitride semiconductor multilayer film a ridge stripe that has a front end facet and a rear end facet facing the front end facet and serves as an optical waveguide, wherein
multiple ones of the recess, the stepped portion, or the protruding portion are provided discontinuously, and
in the step (b), the ridge stripe is formed so that a distance from a lateral center of the ridge stripe to a lateral center of the recess, the stepped portion, or the protruding portion changes from the front end facet toward the rear end facet whereby bandgap energy of the active layer is changed continuously or in stages from the front end facet toward the rear end facet, and
the ridge stripe is formed along the recesses, the stepped portions, or the protruding portions.

* * * * *